(12) United States Patent
Lin et al.

(10) Patent No.: US 7,161,204 B2
(45) Date of Patent: Jan. 9, 2007

(54) DRAM CAPACITOR STRUCTURE WITH INCREASED ELECTRODE SUPPORT FOR PREVENTING PROCESS DAMAGE AND EXPOSED ELECTRODE SURFACE FOR INCREASING CAPACITOR AREA

(75) Inventors: Chun-Chieh Lin, Hsin-Chu (TW); Lan-Lin Chao, Taipei (TW); Chia-Shiung Tsai, Hsin-Chu (TW); Fu-Liang Yang, Hsin-Chu (TW); Chia-Hui Lin, Hsin-Chu (TW); Chanming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/098,112

(22) Filed: Apr. 4, 2005

(65) Prior Publication Data

US 2005/0179076 A1 Aug. 18, 2005

Related U.S. Application Data

(62) Division of application No. 10/802,564, filed on Mar. 17, 2004, now Pat. No. 6,875,655.

(30) Foreign Application Priority Data

Mar. 17, 2003 (TW) ............................... 92105779 A

(51) Int. Cl.
*H01L 27/108* (2006.01)
*H01L 29/76* (2006.01)
*H01L 29/94* (2006.01)
*H01L 31/119* (2006.01)

(52) U.S. Cl. .................... 257/296; 257/303; 257/306

(58) Field of Classification Search ........ 257/295–296, 257/303, 304, 306, 307; 438/253, 254, 396
See application file for complete search history.

(56) References Cited

U.S. PATENT DOCUMENTS

| | | | | |
|---|---|---|---|---|
| 5,604,696 | A | * | 2/1997 | Takaishi ..................... 365/149 |
| 6,130,128 | A | | 10/2000 | Lin |
| 6,180,483 | B1 | | 1/2001 | Linliu |
| 6,184,081 | B1 | * | 2/2001 | Jeng et al. .................. 438/253 |
| 6,187,624 | B1 | | 2/2001 | Huang |
| 6,187,625 | B1 | | 2/2001 | Lin et al. |
| 6,656,844 | B1 | * | 12/2003 | Lin et al. .................... 438/700 |
| 6,730,956 | B1 | | 5/2004 | Bae et al. |

* cited by examiner

*Primary Examiner*—Thanhha S. Pham
(74) *Attorney, Agent, or Firm*—Haynes and Boone, LLP

(57) ABSTRACT

A method for fabricating a high-density array of crown capacitors with increased capacitance while reducing process damage to the bottom electrodes is achieved. The process is particularly useful for crown capacitors for future DRAM circuits with minimum feature sizes of 0.18 micrometer or less. A conformal conducting layer is deposited over trenches in an interlevel dielectric (ILD) layer, and is polished back to form capacitor bottom electrodes. A novel photoresist mask and etching are then used to pattern the ILD layer to provide a protective interlevel dielectric structure between capacitors. The protective structures prevent damage to the bottom electrodes during subsequent processing. The etching also exposes portions of the outer surface of bottom electrodes for increased capacitance (>50%). In a first embodiment the ILD structure is formed between pairs of adjacent bottom electrodes, and in a second embodiment the ILD structure is formed between four adjacent bottom electrodes.

20 Claims, 9 Drawing Sheets

US 7,161,204 B2

DRAM CAPACITOR STRUCTURE WITH INCREASED ELECTRODE SUPPORT FOR PREVENTING PROCESS DAMAGE AND EXPOSED ELECTRODE SURFACE FOR INCREASING CAPACITOR AREA

RELATED APPLICATIONS

This application is a divisional of U.S. patent application Ser. No. 10/802,564, filed Mar. 17, 2004, and entitled, "A Method of Forming DRAM Capacitors with Protected Outside Crown Surface for More Robust Structures," which is hereby incorporated by reference in its entirety. Now U.S. Pat. No. 6,875,655.

BACKGROUND OF THE INVENTION (1) Field of the Invention

This invention relates to semiconductor integrated circuit devices, and more particularly relates to a method for making dynamic random access memory (DRAM) crown capacitors with improved physical strength. The process is particularly useful for crown capacitors for the next generation of DRAM circuits with minimum feature sizes of 0.18 micrometer (um) and less. The invention uses a protective interlevel dielectric (ILD) structure between capacitors while utilizing most of the other surface (>50%) for increasing the capacitance.

(2) Description of the Prior Art

Dynamic random access memory (DRAM) circuits (devices) are used extensively in the electronics industry, and more particularly in the computer industry for storing data in binary form (1s and 0s) as charge on a storage capacitor. These DRAM device are made on a semiconductor substrate (or wafer), and then the substrate is diced to form the individual DRAM circuits (or chips). Each DRAM circuit (chip) consists in part of an array of individual memory cells that store binary data (bits) as electrical charge on the storage capacitors. Further, the information is stored and retrieved from the storage capacitors by means of switching on or off a single access transistor (via word lines) in each memory cell using peripheral address circuits, while the charge stored on the capacitors is sensed via bit lines and by read/write circuits formed on the peripheral circuits of the DRAM chip.

Since the capacitor area is limited to the cell size, in order to accommodate the multitude of cells on the DRAM chip, it is necessary to explore alternative methods for increasing the capacitance while decreasing the lateral area that the capacitor occupies on the substrate surface. In recent years the method of choice is to build stacked capacitors in the vertical direction over the access transistors within each cell area to increase the capacitance of the individual capacitors by increasing the capacitor area in the vertical direction. This provides increased latitude in capacitor design while reducing the cell area.

However, as the minimum feature size for future product is reduced to 0.18 um or less, the ratio of the bottom width to the height of the crown capacitor is dramatically reduced, and the wall of the capacitor bottom electrode is also much thinner. Therefore, it is difficult to form these fragile freestanding capacitor bottom electrodes without resulting in damage during subsequent processing.

To better understand this problem, FIG. 1 shows a crown capacitor on a substrate 10 before removing the interlevel dielectric layer. The partially completed devices, such as the shallow trench isolation and the pass transistors on the substrate, are not depicted to simplify the drawings The method for making the crown capacitors includes depositing a first insulating layer 12 over the partially completed device areas on the substrate 10. Openings 2 for capacitor node contacts are etched in the insulating layer 12 and filled with a conducting material, such as doped polysilicon, tungsten, and the like to form the node contacts 14. A thick second insulating layer 16 (ILD) is deposited and openings 4 are etched over the node contacts 14 for the capacitor bottom electrodes. Then a conformal conducting layer 20 is deposited and polished back to form the bottom electrodes 20 for the capacitors. By retaining the second insulating layer 16, only the inner surface of the conducting layer 20 is used to make the capacitor (referred to as an inner-crown capacitor). However, the available are for making the capacitor is substantially reduced since the outside surface area of the bottom electrode is not used for capacitance.

As shown in FIG. 2 the second insulating layer 16 is completely removed to form freestanding bottom electrodes 20 for the crown capacitors. The capacitor area is substantially increased. However, for future DRAMs having minimum feature sizes less than 0.18 um, the ratio of the height over the width at the base is substantially increased. Because of the extreme height and narrow base, the bottom electrode structure is not sturdy, and is prone to damage during subsequent processing.

One method of reducing the process damage is to partially blanket etch back the ILD layer 16 to provide additional support at the base of the capacitor bottom electrode 20, as shown in FIG. 3. Unfortunately, due to non-uniform loading effects and etching variations across the wafer, non-uniform etching of the ILD layer between the closely spaced bottom electrodes 20 results in poor etch uniformity between the capacitor bottom electrode sand across the wafer, and results in unacceptably large variations in capacitance among individual memory cells when the capacitors are completed.

Numerous methods of making stacked capacitors with vertical structures to increase capacitance while increasing the packing density of the cells have been reported in the literature. For example, U.S. Pat. No. 6,130,128 to Lin and U.S. Pat. No. 6,187,625 B1 to Lin, et al. both describe a method for fabricating a crown capacitor having double sidewalls using a freestanding bottom electrode, as shown in FIG. 2K of both patents. Huang in U.S. Pat. No. 6,187,624 B1 describes a method for making closely spaced capacitors in adjacent recesses. The process forms the capacitor bottom electrode on the inner surface of the recess only. The method is for making closely spaced capacitors with a low-dielectric-constant material between capacitors to reduce coupling. In U.S. Pat. No. 6,180,483 B1 to Linliu describes a method for making multiple crown capacitors. The method relies upon forming freestanding bottom electrodes, as shown in FIG. 1D. None of the above cited references addresses the problem of bottom-electrode damage during subsequent processing.

However, there is till a need in the semiconductor industry to provide crown capacitors having increased uniform capacitance among individual memory cells while reducing the susceptibility to process damage subsequent to making the capacitor bottom electrodes.

SUMMARY OF THE INVENTION

A principal object of the present invention is to make a high-density array of crown capacitor structures having increased height for increased capacitance while reducing processing damage.

Another object of the present invention is to use a novel photoresist mask for selective etching to modify the insulating layer between the bottom electrodes of the crown capacitors to provide support for the bottom electrodes, which prevents subsequent processing damage, while exposing portions of the sidewalls of the bottom electrodes for increased capacitance.

A further object of this invention, by a first embodiment, is to use a novel photoresist mask to pattern the insulating layer to leave portions between pairs of capacitor bottom electrodes for the array of capacitors.

Still another object of this invention, by a second embodiment, is to use a novel photoresist mask to leave portions of the patterned insulating layer contiguous with each group of four adjacent capacitor bottom electrodes for the array of capacitors.

The method for making these improved capacitors using a protective interlevel dielectric (ILD) structure between capacitors to reduce subsequent processing damage while utilizing most of the outer surface (>50%) for increasing the capacitance begins by providing a substrate having partially DRAM devices. Typically the substrate is a P doped single-crystal silicon having a <100> crystallographic orientation. A first insulating layer is deposited on the substrate to electrically insulate the partially completed DRAM devices. An array of first openings are etched in the first insulating layer to the substrate for capacitor node contact plugs. A conducting material, such as doped polysilicon, is deposited to fill the first openings, and is polished back to form the capacitor node contact plugs to the surface of the substrate. A thick second insulating layer is deposited, and an array of second openings are etched in the second insulating layer, aligned over and to the node contact plugs, in which the capacitor bottom electrodes will be formed. A relatively thin conformal first conducting layer is deposited and polished back to the top surface of the second insulating layer to form the capacitor bottom electrodes in the second openings. A key feature of the invention is to patterning the second insulating layer using a patterned photoresist mask and anisotropic plasma etching to leave portions of the second insulating layer between and contacting adjacent bottom electrodes. This novel process step provides physical support for each of the bottom electrodes in the array of bottom electrodes. This additional physical support of each bottom electrode reduces damage during subsequent cleaning and processing operations. Further, the portions of the second insulating layer that are removed expose portions of the outer sidewall areas of the bottom electrodes for increased capacitance. For example, the capacitance can be increased by as much as 50 percent, or more. To complete the array of capacitors, an interelectrode dielectric layer is formed on the bottom electrodes, and a second conducting layer is deposited and patterned to form the capacitor top electrodes.

In a first embodiment, the second insulating layer is patterned to retain a portion of the insulating material between pairs of capacitor bottom electrodes for the array of capacitors to provide additional support and to reduce damage in subsequent processing steps. In a second embodiment an alternative method is described using the patterned second insulating layer to support the capacitors. The second insulating layer is patterned to retain a portion of the insulating material contiguous and between each group of four adjacent capacitor bottom electrodes for the array of capacitors. The second embodiment can be achieved using the mask of the first embodiment and reversing the polarity of the photoresist or the mask. For example, the photoresist type can be changed from positive to negative, or vice versa. Alternatively, the mask or reticle polarity (opacity) can be reversed.

BRIEF DESCRIPTION OF THE DRAWINGS

The above objects and advantages of this invention are best understood when read in conjunction with the attached drawings in the figures.

DESCRIPTION OF THE PREFERRED EMBODIMENTS

The method for making an array of improved crown capacitors is now described in detail. The invention utilizes portions of an interlevel dielectric structure between capacitors to reduce subsequent processing damage while utilizing the remaining exposed outer surface (>50%) for increasing the capacitance. Although the drawings depict a method for making capacitor bottom electrode structures having essentially rectangular shapes, it should be understood by those skilled in the art that the method is also applicable to capacitors having other shapes such as cylindrical, oval, and the like.

Figure 1:
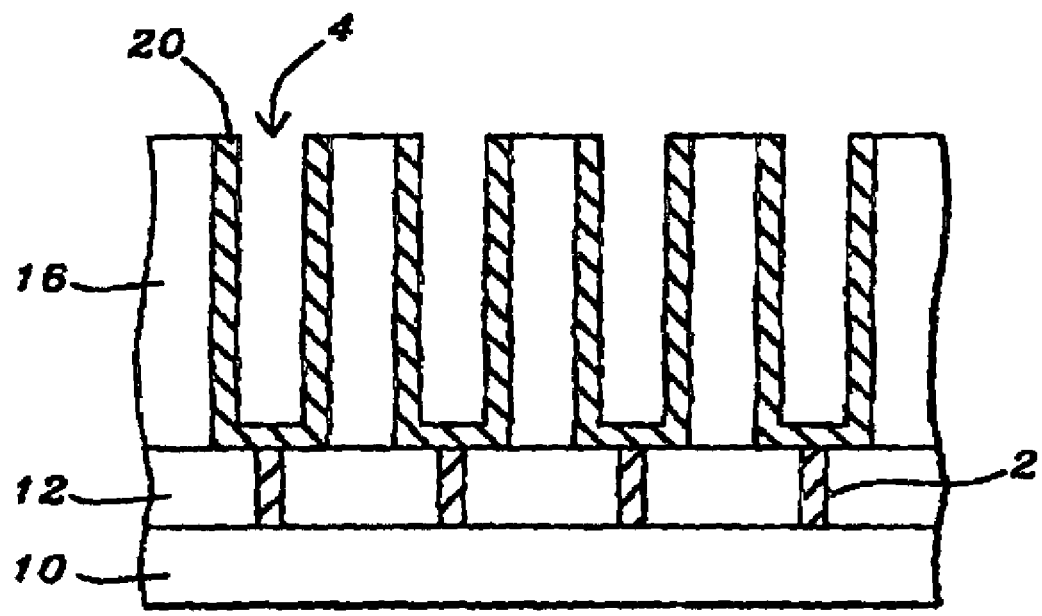
FIGS. 1 through 3 are schematic cross-sectional views showing three conventional means of making crown capacitors and depict the physical limitations.
Figure 2:
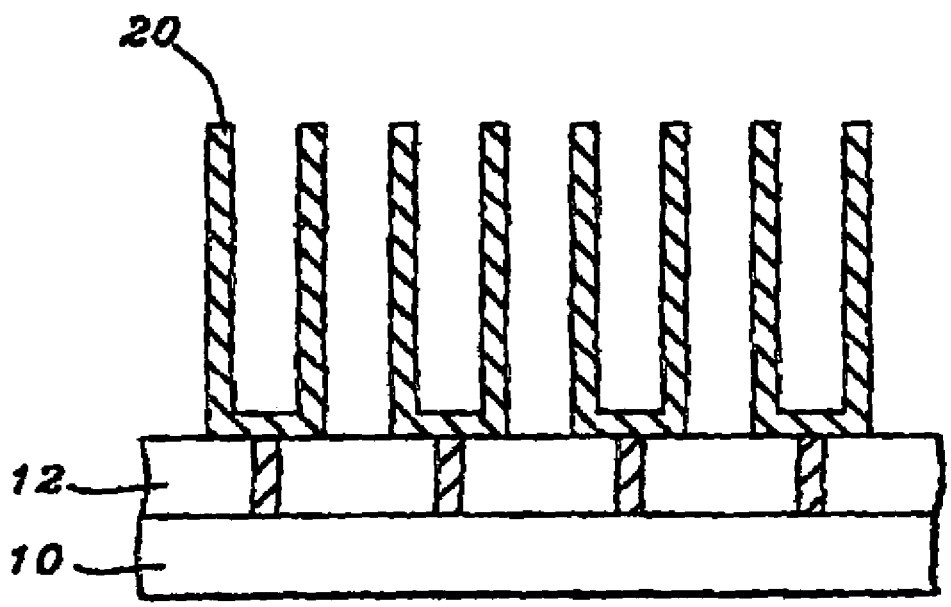
Figure 3:
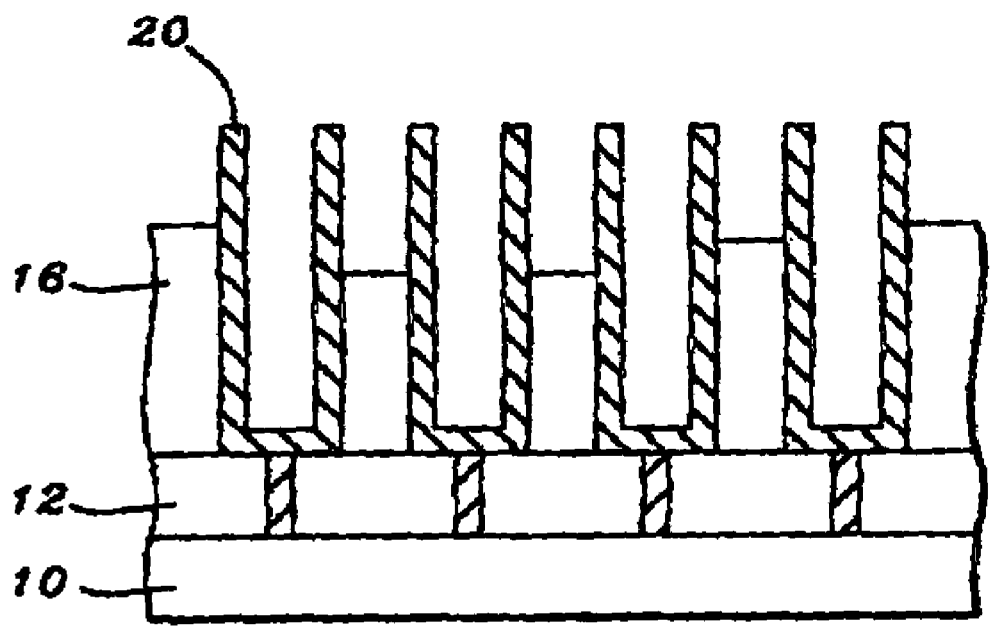
Figure 4:
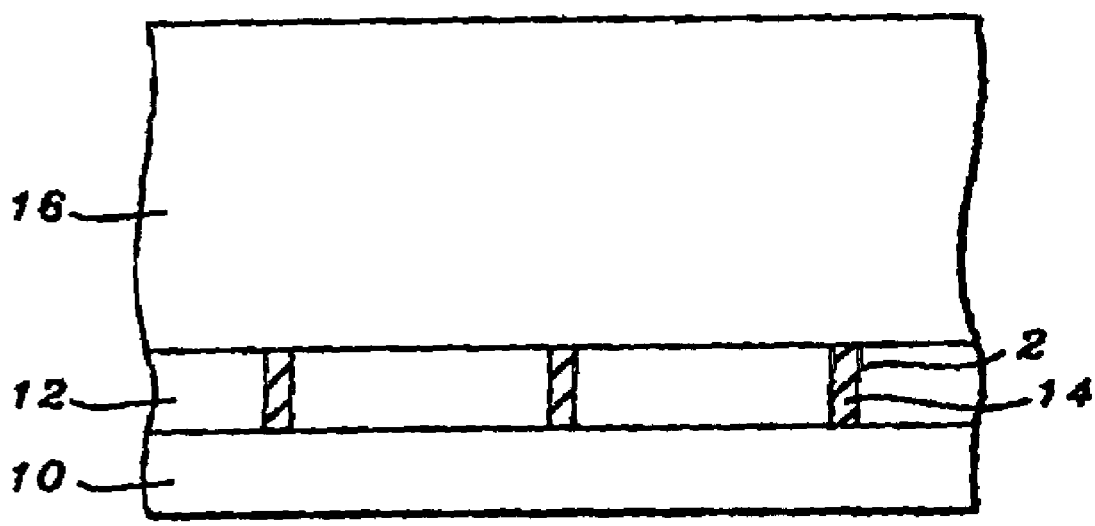
FIGS. 4 through 6 are schematic cross-sectional views showing the sequence of process steps for making crown capacitors up to the formation of the bottom electrodes.

Referring to FIG. 4, the method beings by providing a substrate 10 having partially completed DRAM devices (not shown). Typically the substrate is a P doped single-crystal silicon having a <100> crystallographic orientation on and in which semiconductor devices, such as FETs, are formed. A first insulating layer 12 is deposited on the substrate 10 to electrically insulate the partially completed DRAM devices. The first insulating 12 is preferably silicon oxide ($SiO_2$) deposited, for example, by low-pressure chemical vapor deposition (LPCVD). Although not depicted in the Figs., layer 12 can also include a barrier layer, such as silicon nitride ($Si_3N_4$), and layer 12 can also be doped, for example with boron and/or phosphorus, to reduce ionic contamination, such as sodium, of the underlying devices. The first insulating layer 12 is deposited to a preferred thickness of between about 100 and 5000 Angstroms.

Still referring to FIG. 4, an array of first openings 2 are etched in the first insulating layer 12 to the substrate 10 for capacitor node contact plugs. Conventional photolithographic techniques and anisotropic plasma etching are used to etch the first openings 2. A conducting material 14 is deposited sufficiently thick to fill the first openings 2. The conducting material is preferably an N doped polysilicon, and is deposited by CVD using a reactant gas such as silane ($SiH_4$). Alternatively, other conducting materials, such as tungsten, tungsten silicide, aluminum-copper, and the like, can be used, and a barrier layer can also be included to improve adhesion and prevent unwanted interactions between the conducting material and the substrate 10. The barrier layer is not depicted in the Figs to simplify the drawings. The conducting material 14 is then polished or etched back to the surface of the first insulating layer 12 to form capacitor node contact plugs 14, which are coplanar with the surface of the first insulating layer 12, as shown in FIG. 4.

Continuing with FIG. 4, a thick second insulating layer 16 is deposited. Layer 16 is preferably a CVD $SiO_2$ and is deposited using a reactant gas such as tetraethosiloxane (TEOS). Layer 16 is deposited to a thickness equal to the desired height of the bottom electrodes for the crown capacitor, and more specifically is deposited to a thickness of between about 1000 and 100000 Anstroms.

Figure 5:
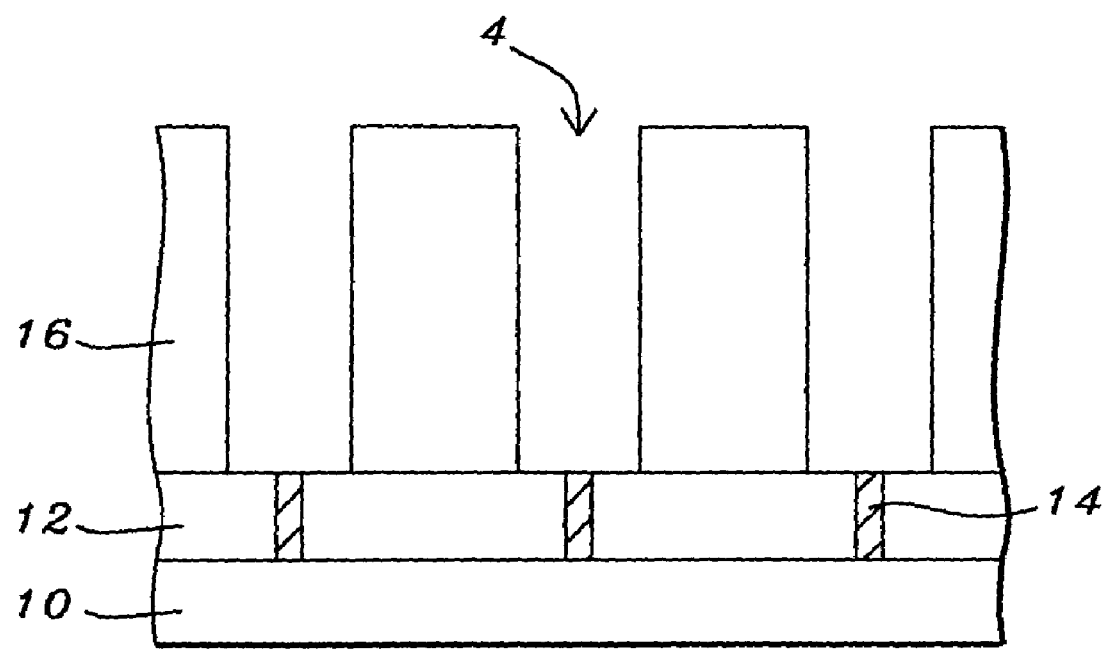

Next as shown in FIG. 5, an array of second openings 4 are etched in the second insulating layer 16 for the bottom electrodes. The openings 4 are aligned over and etched to the surface of the node contact plugs 14. The etching is preferably carried out using a reactive ion etcher (RIE) or a high-density plasma (HDP) etcher and an etchant gas mixture, for example, a gas containing fluorine atoms.

Figure 6:
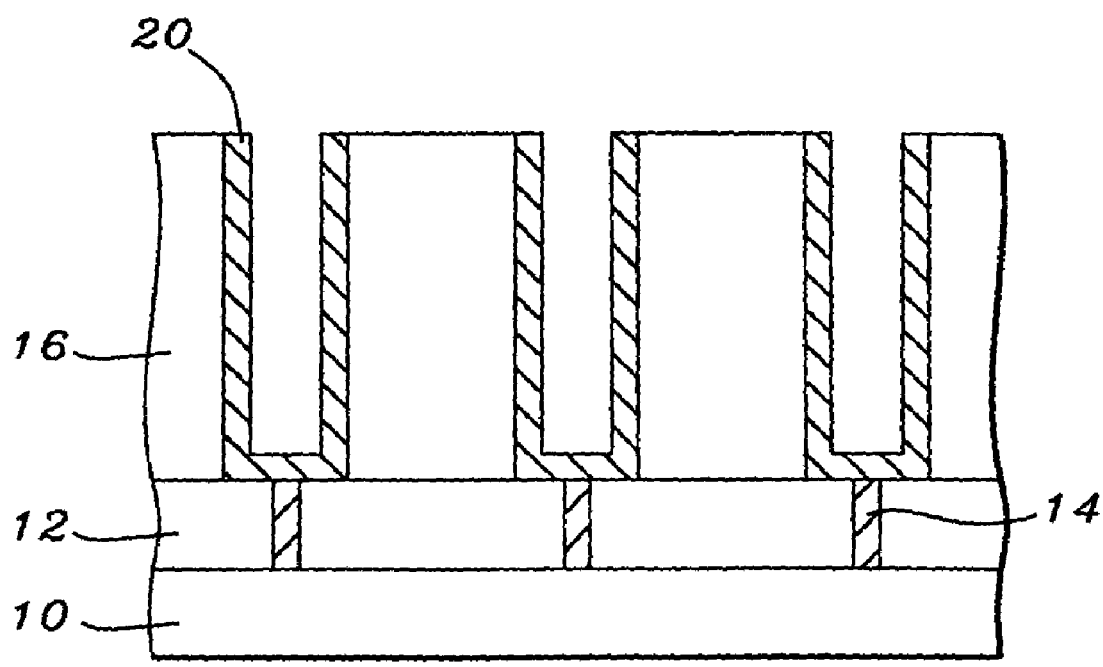

A shown in FIG. 6, a relatively thin conformal first conducting layer 20 is deposited and polished back to the top surface of the second insulating layer 16 to form the capacitor bottom electrodes 20 in the second openings 4. The first conducting layer 20 is preferably a doped polysilicon layer or a metal silicde layer. Also, a metal such as copper, aluminum, or tungsten can be used for the first conducting layer 20. Alternatively, if a high-dielectric (high-k) film, such as $Ta_2O_5$ and the like, is used in the capacitor, a more exotic conducting material can be used for the capacitor bottom electrodes to prevent interface reactions.

Figure 7A:
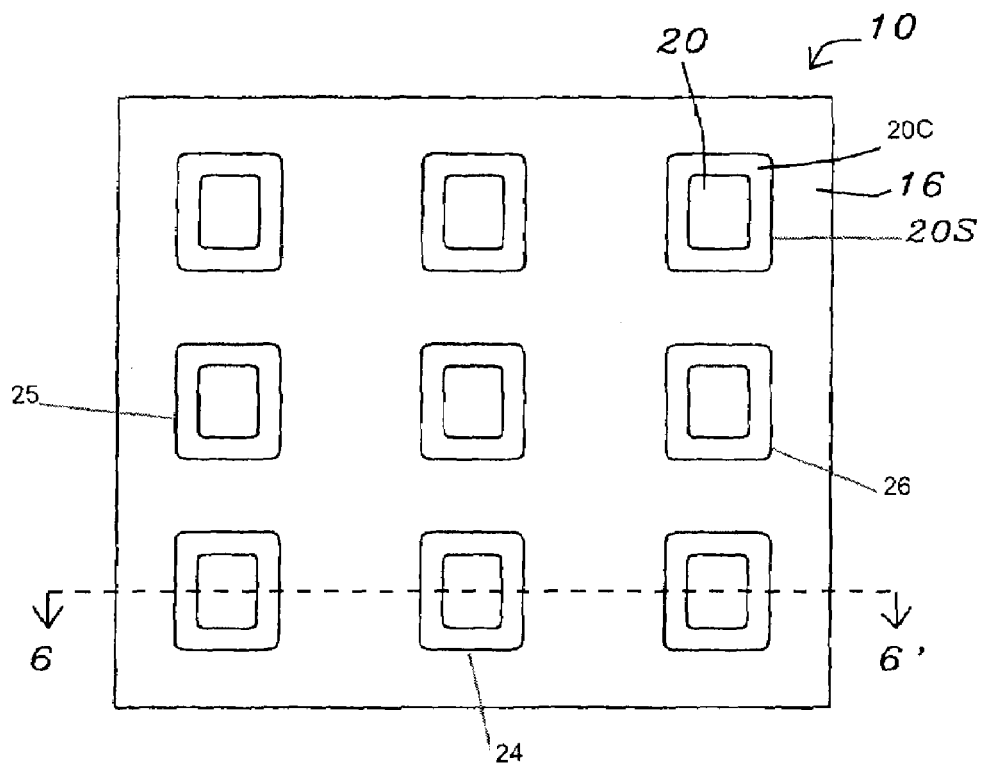
FIGS. 7A through 7C are schematic top views of a portion of the array of crown capacitors and depict the masking the etching steps to achieve the objectives of the first embodiment.

FIG. 7A shows a top view of FIG. 6 and depicts the partially completed capacitors up to the completed bottom electrodes 20. The cross section in FIG. 6 is for the region 6-6' in FIG. 7A. The top view of FIG. 7A shows a portion of an array of capacitor bottom electrodes. Only nine of the capacitor bottom electrodes 20 are depicted to simplify the drawing. Each of the capacitor bottom electrodes 20 comprises outer surfaces 20S that are interdigitated with corner portions 20C. In the context of the present disclosure, interdigitate refers to interlocking. Thus, the outer surfaces 20S of the bottom electrodes are interlocked with corner portions 20C. Each electrode 20 is diagonally aligned with another electrode. For example, electrode 24 is diagonally aligned with electrode 25 and electrode 26. The top view depicts the bottom electrodes 20 in the second openings 4 formed in the second insulating layer 16.

Figure 7B:
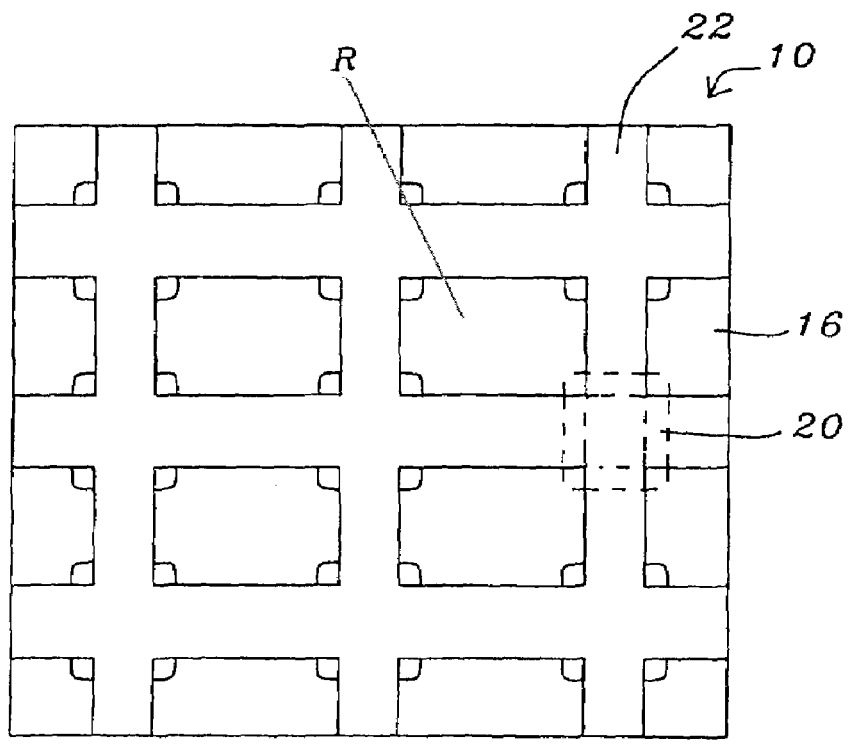

Referring now to FIG. 7B, a key feature of the invention is to design a novel photoresist mask 22 to selectively protect areas of the second insulating layer 16 from etching between adjacent bottom electrodes. The patterned photoresist mask 22 also extends over the array of bottom electrodes 20 to protect the bottom electrodes during etching. The photoresist mask 22 is designed to expose layer 16 in the regions R between four adjacent bottom electrodes. The second insulating layer 16 is then anisotropically plasma etched to the first insulating layer 12 to expose corner portions 20C of the bottom electrodes 20. A plasma ashing in oxygen and/or wet stripping is used to remove the photoresist mask 22. After removing the photoresist 22, the remaining second insulating layer 16 between adjacent pairs of bottom electrodes 20, for example, between electrodes 24 and 27, results in the more robust structure shown in the top view of FIG. 7C. The etching removes the second insulating layer 16 from regions R exposing the outer corner portions 20C of the bottom electrodes 20 to increase the capacitor area.

Figure 7C:
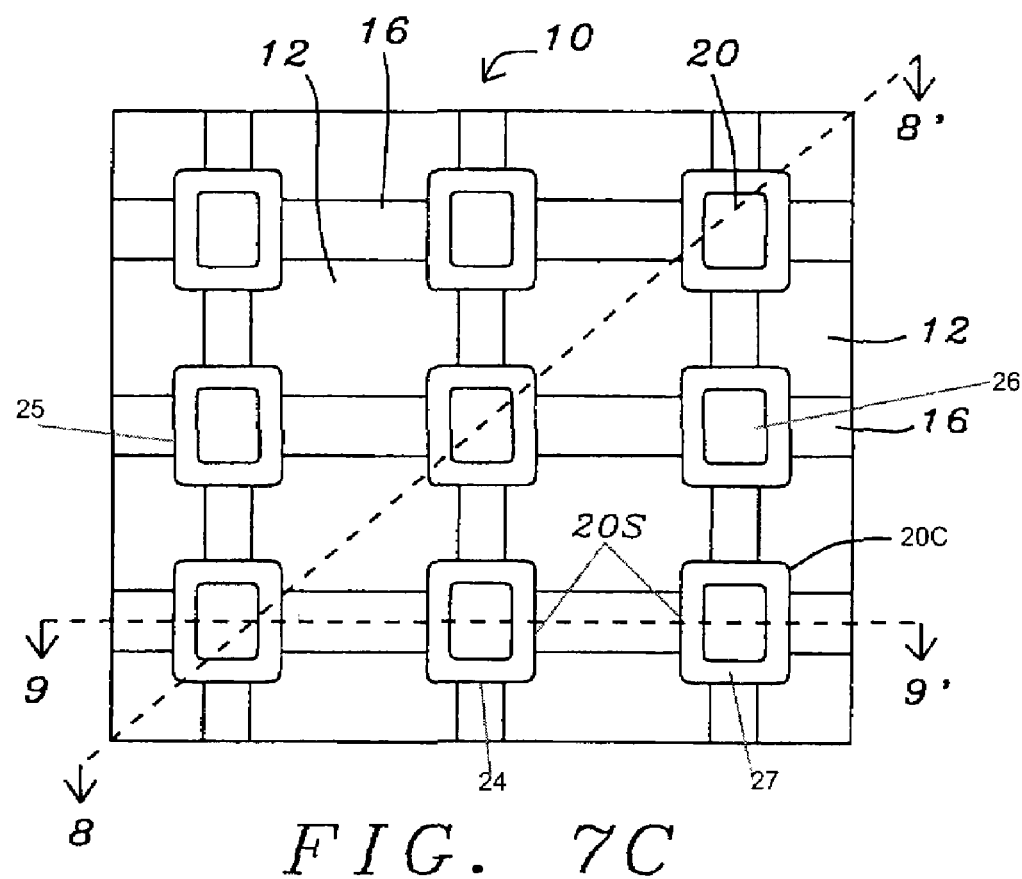
Figure 8:
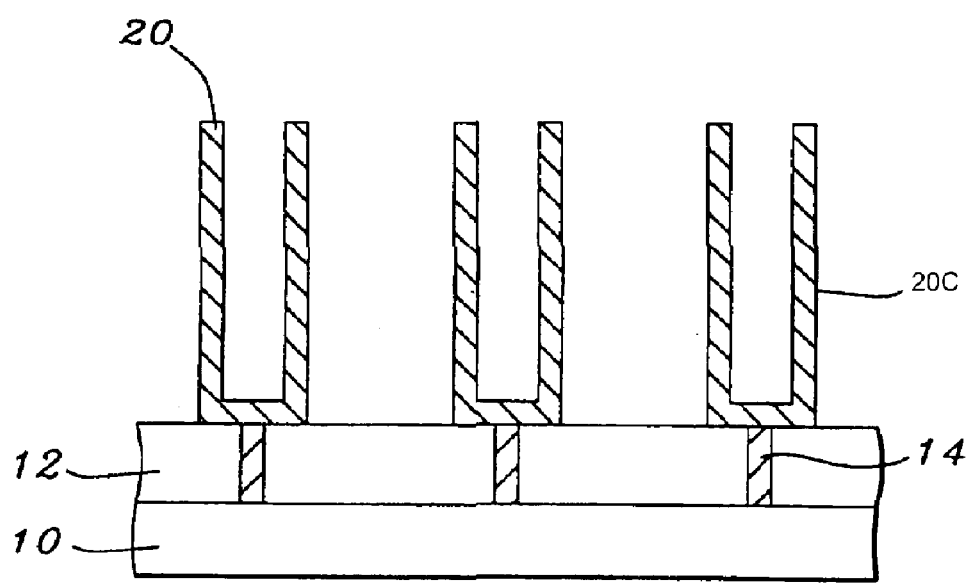
FIG. 8 is a schematic cross-sectional view of the crown capacitor structure of FIG. 7C through the portion 8-8' and depicting the insulating support joining two adjacent capacitors.
Figure 9:
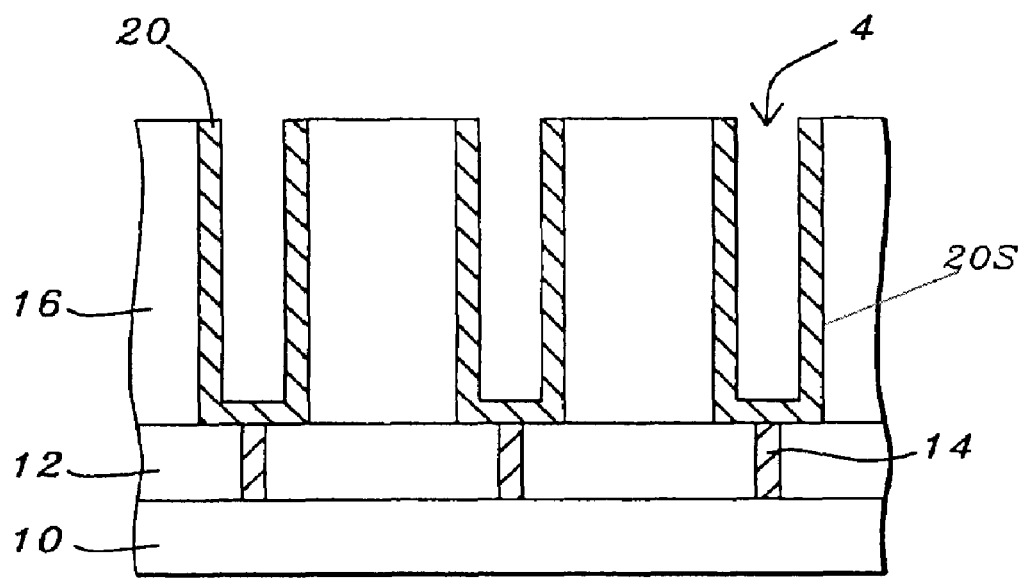
FIG. 9 is a schematic cross-sectional view of the crown capacitor structure of FIG. 7C through the portion 9-9' and depicting the exposed outer sidewalls of the bottom electrodes for increased capacitance.

To better appreciate the advantages of the invention, FIG. 8 shows a cross section through the region 8-8' of FIG. 7C, and FIG. 9 shows a cross section through the region 9-9' of FIG. 7C. The cross section through the region 8-8' shows the exposed corner portions 20C of the bottom electrodes that are generally diagonally aligned for increased capacitance. For example, corner portions 20C of electrodes 24 and 26 are exposed. Thus, the corner portion 20C of electrode 24 and the corner portion 20C of electrode 26 faces each other across a space that is disposed between the diagonally aligned pair of electrodes 24 and 26. The corner portions of electrodes 24 and 26 are unobstructed by the second insulating layer 16. By controlling the dimensions of the patterned photoresist mask and etching, the exposed corner portions 20C of the bottom electrode can be increased in area to increase capacitance by as much as 50 percent, or more. FIG. 9 shows the cross section through the region 9-9' having the retained second insulating layer 16 supporting adjacent pairs of bottom electrodes 20. Thus, the second insulating layer 16 extends between the outer surfaces 20S of each adjacent pair of electrodes, for example, between electrodes 24 and 27. The increased physical supporting structure 16 prevents damage to the bottom electrodes 20 during subsequent processing.

In a second embodiment an alternative method is described using a different design for patterning the second insulating layer 16 to support the capacitor bottom electrodes 20. The second embodiment is the same as the first embodiment up to and including the structure shown in FIG. 6. One method of achieving the objectives of the second embodiment is to reverse the polarity (opacity) of the reticle used to expose the photoresist layer of the first embodiment. Alternatively, the photoresist type (positive or negative resist) can be changed instead of making a reticle with reversed polarity.

Figure 10A:
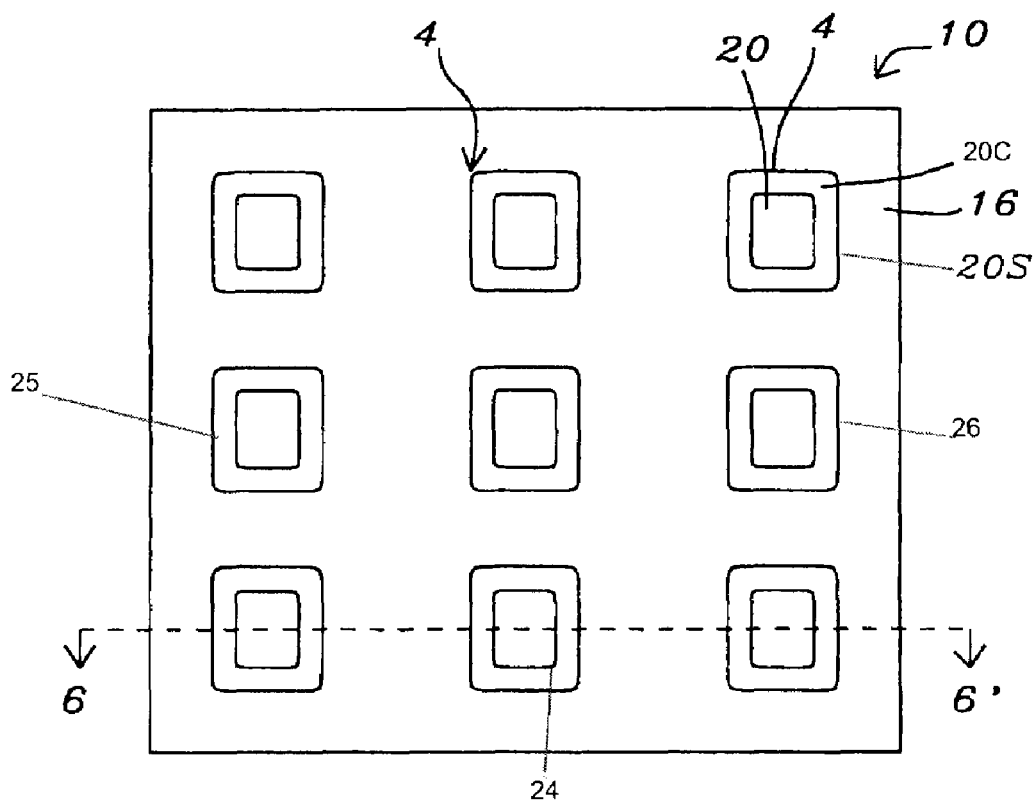
FIG. 10A through 10C are schematic top views of the array of crown capacitors and depict the masking and etching steps to achieve the objectives of the second embodiment.

Referring to FIG. 10A, a top view of FIG. 6 shows the partially completed capacitors up to the completed bottom electrodes 20. The cross section in FIG. 6 is for the region 6-6' in FIG.10 The top view of FIG. 10A shows a portion of an array of capacitor bottom electrodes 20. Only nine of the capacitor bottom electrodes 20 are depicted to simplify the drawing. Each of the capacitor bottom electrodes 20 comprises outer surfaces 20S that are interdigitated with corner portions 20G. In the context of the present disclosure, interdigitate refers to interlocking. Thus, the outer surfaces 20S of the bottom electrodes are interlocked with corner portions 20G. Each electrode 20 is diagonally aligned with another electrode. For example, electrode 24 is diagonally aligned with electrode 25 and electrode 26. The top view depicts the bottom electrodes 20 in the second openings 4 formed in the second insulating layer 16.

Figure 10B:
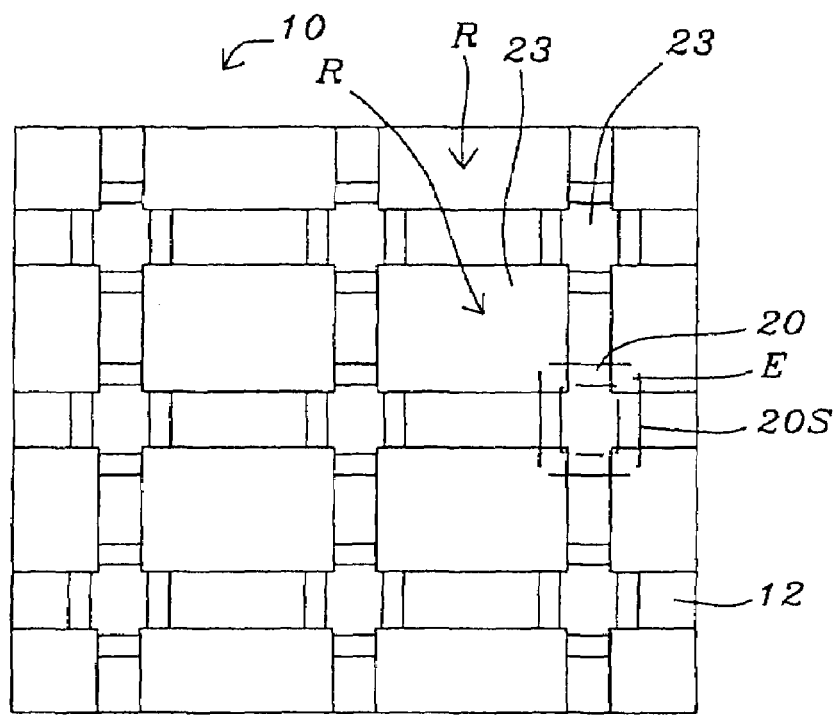

Referring now to FIG. 10B, a key feature of the second embodiment is to design a novel photoresist mask 23 to selectively protect areas of the second insulating layer 16 from etching. The photoresist mask 23 protects the regions R between four adjacent bottom electrodes, and extends over the edge E of each bottom electrode 20. The photoresist is exposed and partially developed to expose to the top surface of the second insulating layer 16 and to leave portions of the photoresist in the second openings 4 to protect the corner portions 20C of generally diagonally pairs of electrodes 20 during the oxide etching step. The second insulating layer 16 is then anisotripically plasma etched to the first insulating layer 12 to expose outside surface 20S between adjacent pairs of the bottom electrodes 20. A plasma ashing in oxygen and/or wet stripping is then used to remove the remaining photoresist mask 23.

Figure 10C:
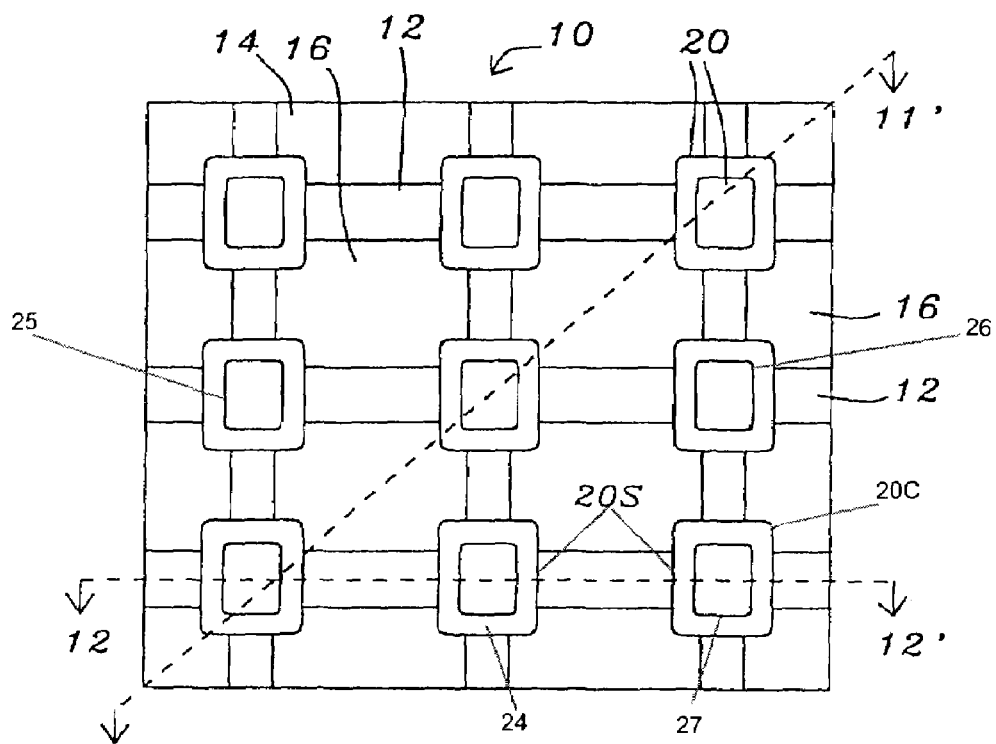

As shown in the top view of FIG. 10C, after the photoresist is remove, the remaining second insulating layer 16 between corner portions of the generally diagonally aligned pairs of bottom electrodes 20 results in the more robust structure. For example, the second insulating layer 16 extends between corner portions 20C of a generally diagonally aligned pair of electrodes 24 and 26. Also, after etching the second insulating layer 16 between adjacent pairs of bottom electrodes 20 to the surface of the first insulating layer 12, the outer sidewalls 20S of the adjacent pairs of electrodes 20 are exposed to increase the capacitor area. For example, the outer sidewalls 20S of electrodes 24 and 27 are exposed and a space is disposed between the adjacent pairs of electrodes and is unobstructed by the second insulating layer 16.

Figure 11:
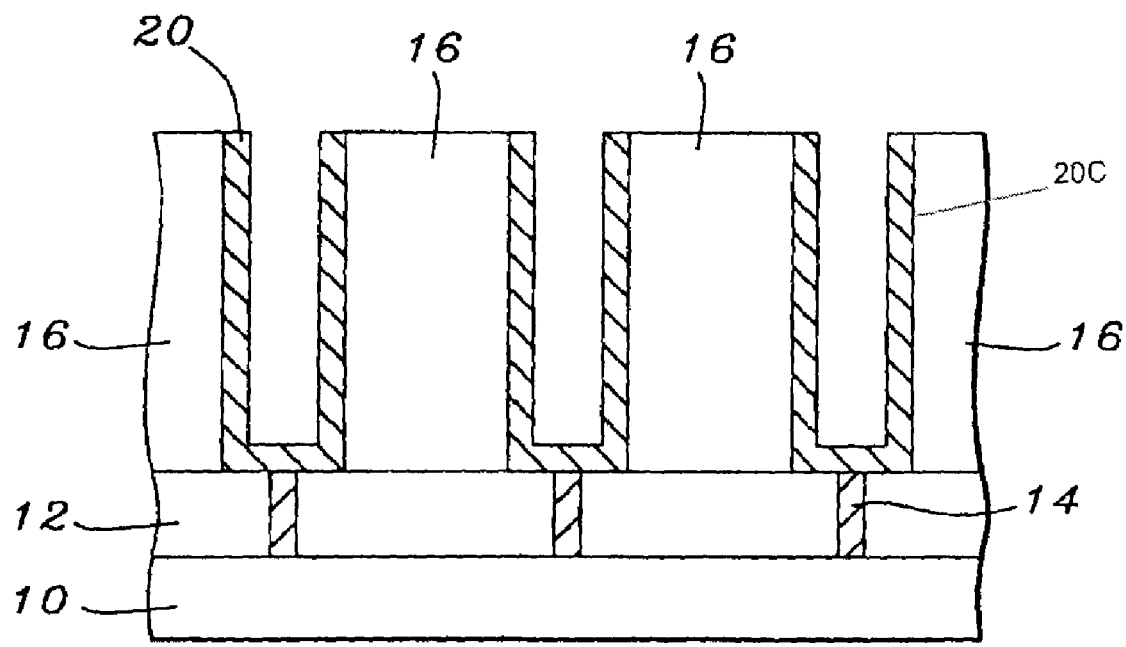
FIG. 11 is a schematic cross-sectional view of the crown capacitor structure of FIG. 10C through the portion 11-11' and depicting the exposed outer sidewalls of the bottom electrodes for increased capacitance.
Figure 12:
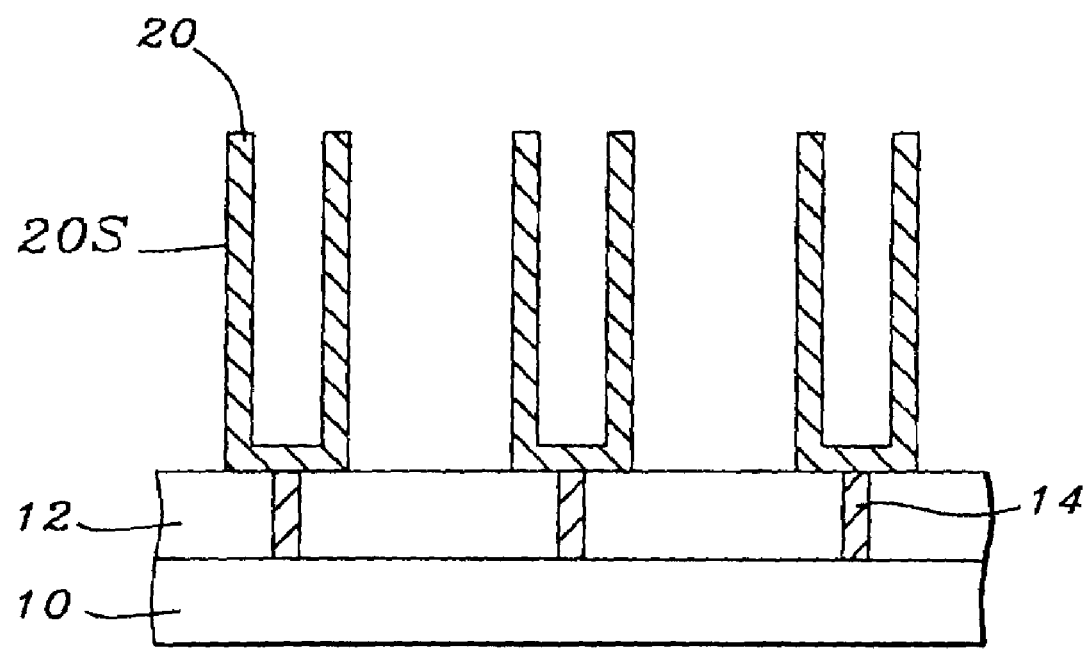
FIG. 12 is a schematic cross-sectional view of the crown capacitor structure of FIG. 10C through the portion 12-12' and depicting the insulating support joining four adjacent capacitors.

To better appreciate the advantages of the second embodiment, FIG. 11 shows a cross section through the region 11-11' of FIG. 10C, and FIG. 12 shows a cross section through the region 12-12' of FIG. 10C. The cross section through the region 11-11' shows the portions of the second insulating layer 16 retained between aiA corner portions 20C of the generally diagonally aligned pairs of bottom electrodes 20. This increased physical supporting structure 16 prevents damage to the generally diagonally aligned pairs of bottom electrodes 20 during subsequent processing. FIG. 12 shows the cross section through the region 12-12' where the second insulating layer 16 is removed between adjacent pairs of bottom electrodes 20, for example, electrodes 24 and 27. This exposes the outside surface 20S between adjacent pairs of bottom electrodes for increased capacitance area. By controlling the dimensions of the patterned photoresist mask and etching, the exposed outer surface 20S of the bottom electrode can be increased in area to increase capacitance by as much as 50 percent, or more.

Figure 13:
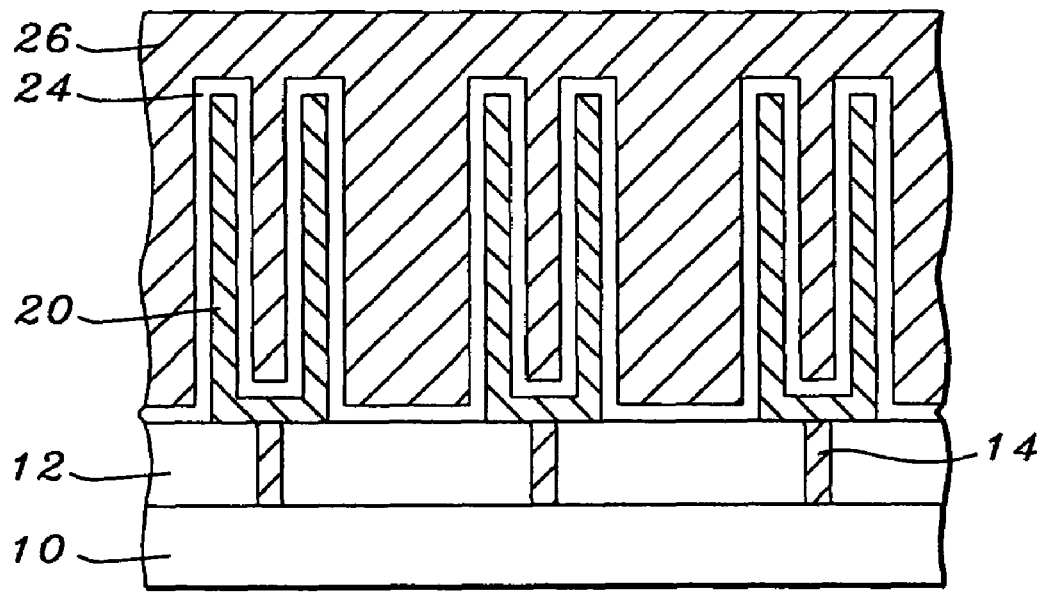
FIGS. 13 and 14 are schematic cross-sectional views showing the completed capacitors after forming the interelectrode dielectric layer and the top electrode plates.
Figure 14:
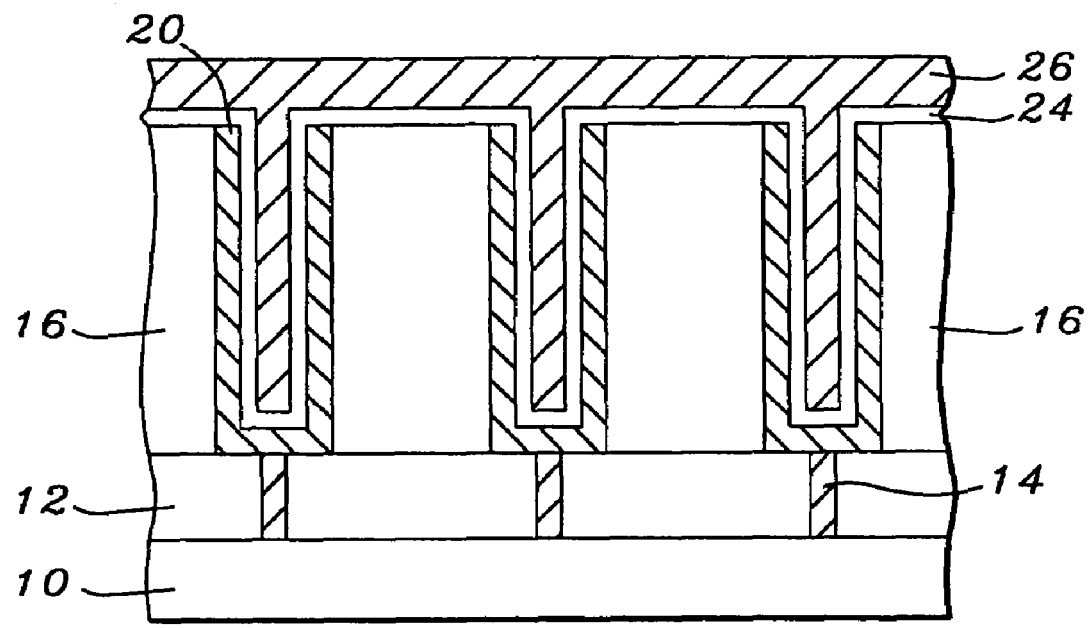

Referring to FIGS. 13 and 14, the array of capacitors is completed. The remaining process steps are depicted for the second embodiment and are shown for the two respective cross sections through 11-11' and 12-12' of FIG. 10C. To complete the array of capacitors, a thin interelectrode dielectric layer 24 is formed on the bottom electrodes 20. For example, when the bottom electrodes 20 are a polysilicon, layer 24 is preferably silicon oxide/silicon nitride/silicon oxide (ONO). The ONO layer 24 can be formed by depositing a $Si_3N_4$ layer, which is then reduced in an oxygen ambient to form the $SiO_2$, and another $Si_3N_4$ layer is deposited. Alternatively, a high-dielectric material, such as tantalum pentoxide and the like, can be used for layer 24 when the bottom electrodes 20 are metal. Layer 24 is formed to a thickness of between about 1 and 100 Angstroms. The array of capacitors is now completed by forming capacitor top electrodes 26. The top electrodes are formed by depositing and patterning a doped polysilicon layer 26 when layer 24 is ONO. Alternatively the top electrodes are formed by depositing and patterning a metal layer 26 when layer 24 is a high-k material.

While the invention has been particularly shown and described with reference to the preferred embodiments thereof, it will be understood by those skilled in the art that various changes in form and details may be made without departing from the spirit and scope of the invention. The invention is described for a single-walled crown capacitor structure. However, it should be understood that the method of retaining portions of an insulating layer between and contiguous with the outer sidewalls of adjacent capacitor bottom electrodes can also apply to more complex crown structures having multi-walled capacitors.

What is claimed is:

1. An array of capacitors for dynamic random access memory (DRAM) devices comprised of:
   a substrate having partially completed device areas for said DRAM devices;
   a first insulating layer having first openings to said substrate;
   capacitor node contact plugs in said first openings;
   a second insulating layer with second openings aligned over and to said node contact plugs, and capacitor bottom electrodes in said second openings;
   wherein, as viewed from top of the array of capacitors, each of the capacitor bottom electrodes comprises outer surfaces interdigitated with corner portions, each electrode being generally diagonally aligned with at least one other electrode, the second insulating layer extends between the outer surfaces of each adjacent pair of electrodes, and corner portions of each diagonally aligned pair of electrodes face each other across a space disposed between the diagonally aligned pair of electrodes and unobstructed by the second insulation layer; and
   an interelectrode dielectric layer on said bottom electrodes, and capacitor top electrodes on the interelectrode dielectric layer.

2. The array of capacitors of claim 1, wherein said first insulating layer has a thickness of between about 100 and 5000 Angstroms.

3. The array of capacitors of claim 1, wherein said capacitor node contact plugs are an electrically conducting material selected from the group consisting of doped polysilicon, tungsten, aluminum-copper, and copper.

4. The array of capacitors of claim 1, wherein said second insulating layer has a thickness of between 1000 and 100000 Angstroms.

5. The array of capacitors of claim 1, wherein said bottom electrodes are an electrically conducting material selected from the group consisting of doped polysilicon, metal silicide, aluminum, copper, and tungsten.

6. The array of capacitors of claim 1, wherein the space disposed between the diagonally aligned pair of electrodes increase capacitance by at least 50 percent.

7. The array of capacitors of claim 1, wherein said interelectrode dielectric layer is silicon oxide/silicon nitride/silicon oxide or tantalum pentoxide.

8. The array of capacitors of claim 1, wherein said interelectrode dielectric layer is a high k dielectric.

9. The array of capacitors of claim 8, wherein said high k dielectric material is a metal oxide, a metal nitride, a metal silicate, a transition-metal oxide, a transition-metal nitride, a transition-metal silicate, an oxynitride of a metal, a metal aluminate, zirconium silicate, zirconium aluminate, $HfO_2$, $ZrO_2$, $ZrO_xN_y$, $HfO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PXT, PMN, or a combination thereof.

10. The array of capacitors of claim 8, wherein said electrodes are an electrically conducting material selected from the group consisting of doped polysilicon, copper and aluminum.

11. An array of capacitors for dynamic random access memory (DRAM) devices comprised of:
a substrate having partially completed device areas for said DRAM devices;
a first insulating layer having first openings to said substrate;
capacitor node contact plugs in said first openings;
a second insulating layer with second openings aligned over and to said node contact plugs, and capacitor bottom electrodes in said second openings;
wherein as viewed from top of the array of capacitors, each of the capacitor bottom electrodes comprises outer surfaces interdigitated with corner portions, each electrode being generally diagonally aligned with at least one other electrode, the second insulating layer extends between corner portions of each diagonally aligned pair of electrodes, the outer surfaces of each adjacent pair of electrodes face each other across a space disposed between the adjacent pair of electrodes and unobstructed by the second insulation layer;
an interelectrode dielectric layer on said bottom electrodes, and capacitor top electrodes on the interelectrode dielectric layer.

12. The array of capacitors of claim 11, wherein said first insulating layer has a thickness of between about 100 and 5000 Angstroms.

13. The array of capacitors of claim 11, wherein said capacitor node contact plugs are an electrically conducting material selected from the group consisting of doped polysilicon, tungsten, aluminum-copper, and copper.

14. The array of capacitors of claim 11, wherein said second insulating layer has a thickness of between 1000 and 100000 Angstroms.

15. The array of capacitors of claim 11, wherein said bottom electrodes are an electrically conducting material selected from the group consisting of doped polysilicon, metal silicide, aluminum, copper, and tungsten.

16. The array of capacitors of claim 11, wherein the space disposed between the adjacent pair of electrodes increase capacitance by at least 50 percent.

17. The array of capacitors of claim 11, wherein said interelectrode dielectric layer is silicon oxide/silicon nitride/silicon oxide or tantalum pentoxide.

18. The array of capacitors of claim 11, wherein said interelectrode dielectric layer is a high k dielectric.

19. The array of capacitors of claim 18, wherein said high k dielectric material is a metal oxide, a metal nitride, a metal silicate, a transition-metal oxide, a transition-metal nitride, a transition-metal silicate, an oxynitride of a metal, a metal aluminate, zirconium silicate, zirconium aluminate, $HfO_2$, $ZrO_2$, $ZrO_xN_y$, $HfO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PXT, PMN, or a combination thereof.

20. The array of capacitors of claim 18, wherein said electrodes are an electrically conducting material selected from the group consisting of doped polysilicon, copper and aluminum.

* * * * *